United States Patent [19]
Huang et al.

[11] Patent Number: 6,104,184
[45] Date of Patent: Aug. 15, 2000

[54] METHOD AND APPARATUS FOR LOADING A WAFER INTO A TEST MACHINE

[75] Inventors: K. C. Huang, Chu-Tong; S. T. Wang, Hsin-Chu, both of Taiwan

[73] Assignee: Taiwan Semiconductor Manufacturing Company, Ltd., Hsin Chu, Taiwan

[21] Appl. No.: 08/971,814

[22] Filed: Nov. 17, 1997

[51] Int. Cl.$^7$ ............................... G01R 31/02; B66F 9/18
[52] U.S. Cl. ........................................ 324/158.1; 414/590
[58] Field of Search .................................. 324/158.1, 765, 324/754, 757, 758; 209/573; 414/590

[56] References Cited

U.S. PATENT DOCUMENTS

| | | | |
|---|---|---|---|
| 4,103,232 | 7/1978 | Sugita et al. ............................... | 324/754 |
| 4,901,011 | 2/1990 | Koike et al. ............................... | 324/765 |
| 5,479,108 | 12/1995 | Cheng ....................................... | 324/765 |
| 5,604,443 | 2/1997 | Kitamura et al. ........................ | 324/754 |

*Primary Examiner*—Ernest Karlsen
*Attorney, Agent, or Firm*—Tung & Associates

[57] ABSTRACT

The present invention discloses a removable wafer mounting tray for positioning a wafer in a microscope by utilizing a tray body that is generally constructed in a disk shape and has a recess in its top surface for receiving a wafer to be tested. The wafer mounting tray further includes a handle that extends outwardly from the tray adapted for gripping by a machine arm or by a human hand for placement of the wafer mounting tray into a test machine. The novel wafer mounting tray shelters and protects a wafer during transit to and from a test machine such that wafer breakage or scratching problems can be substantially reduced.

6 Claims, 2 Drawing Sheets

METHOD AND APPARATUS FOR LOADING A WAFER INTO A TEST MACHINE

FIELD OF THE INVENTION

The present invention generally relates to a method and apparatus for a wafer test machine and more particularly, relates to a method and apparatus for a removable wafer mounting tray capable of positioning a wafer in a test machine such that the wafer can be protected from physical damages.

BACKGROUND OF THE INVENTION

In the fabrication of semiconductor integrated circuit (IC) devices, the quality or reliability of devices formed on the wafer must be verified before the wafer is packaged. The tests performed before such packaging step is normally called wafer-level reliability tests. The benefits of performing wafer-level reliability tests are several, for instance, it can maximize in-situ reliability controls to essentially replace product reliability control, and it can provide test results that can be used for fast process feedback, for malfunction or abnormality identification, and for product pass/fail classification.

The wafer-level reliability tests are frequently performed in a test machine in combination with a wafer prober. The wafer prober carries a wafer on a stage and, through an indexing system, moves the stage three dimensionally such that various dies situated on the wafer can be tested individually. In a typical wafer-level reliability test, the data obtained can be used to study the device characteristics for process feedback and to classify dies (or chips) for various degrees of quality or reliability for the purpose of product sorting. Major categories of wafer-level reliability tests include parametric tests for testing the device parameters, gross problem tests such as electrical continuity for detecting open or short circuits, leakage mechanism tests for device component such as diodes or transistors, for device isolation and for chip-level leakage in operating and standby modes, and various chip functionality tests such as, for a memory device, the functions of pause distribution, device timings, tests patterns, and reliability in the form of voltage stress.

Wafer-level reliability tests are normally conducted at a test temperature higher than room temperatures, for instance, between 70° C. and 100° C. or at cold temperatures. The test temperature range is determined by the typical packaged product performance requirement which is in the range between −65° C. to 150° C. In common practice, the wafer-level reliability tests are conducted at higher temperatures which are deemed as sufficient since device performance is generally worse at higher temperatures.

In a typical wafer prober equipped with a microscope observation device, such as that supplied by Electroglas Horizon® 4080X, the wafer inspection process can be carried out by the following process flow. First, a wafer is loaded to a fixative tray by the transfer arm of the prober. The wafer is then picked up by a vacuum pick up device, e.g., a vacuum pan, from the fixative tray and placed into a cassette slot. The cassette is then loaded onto an autoloader manually by a machine operator. The autoloader then transfers the wafer to a microscope stage by a transfer arm.

Concurrently, when the first wafer is being probed or tested, the transfer arm removes the second wafer out of the cassette and transports it to the prealigner. After the prealigning is performed, the transfer arm moves the wafer to a quickloader After the first wafer is completely probed, the transfer arm then removes it from the chucktop and returns it to the cassette. The second wafer is then transported from the quickloader to the chucktop and the probing process is repeated until all wafers in the cassette are probed. Alternatively, only a selected number, i.e., the first, the fifth, the tenth wafer, etc., needs to be tested in order to achieve a more realistic testing period.

In the above test process flow description, it is obvious that the wafer is moved numerous times by the transfer arm and the vacuum pick up device from station to station. During such movements, the wafer is completely unprotected and therefore subjected to numerous potential hazards. For instance, if the vacuum breaks in the vacuum pen, the wafer may drop and suffer a serious breaking or cracking problem. Furthermore, when the wafer is not properly positioned in the cassette, the wafer may fall out during an autoloading process or when later picked up by the transfer arm and then dropped or scratched. The occurrence of any of these problems can lead to serious defects or the complete destruction of the wafer and thus a serious reliability problem and decrease in the yield of the fabrication process.

It is therefore an object of the present invention to provide a method for loading a wafer into a microscope that does not have the drawbacks or shortcomings of the conventional method.

It is another object of the present invention to provide a method for loading a wafer into a microscope that has the wafer protected without risking potential damages to the wafer by making mechanical contacts with the wafer.

It is a further object of the present invention to provide a method for loading a wafer into a microscope that utilizes a removable wafer mounting tray such that a wafer can be securely positioned and protected by the mounting tray during transit in and out of the test machine.

It is another further object of the present invention to provide a method for loading a wafer into a microscope which utilizes a removable wafer mounting tray generally of a disc shape and has a hollow center portion.

It is still another object of the present invention to provide a method for loading a wafer into a microscope by utilizing a removable wafer mounting tray that has a recess in its top surface adapted for receiving a wafer.

It is yet another object of the present invention to provide a method for loading a wafer into a microscope by utilizing a removable wafer mounting tray equipped with a handle extending outwardly from the tray such that it can be gripped by a machine arm or by a human hand.

It is still another further object of the present invention to provide a method for loading a wafer into a microscope by utilizing a removable wafer mounting tray wherein the tray is generally of a circular shape having a hollow center portion.

It is yet another further object of the present invention to provide an apparatus for loading a wafer into a microscope in the form of a removable wafer mounting tray capable of protecting a wafer during transit in and out of a test machine.

SUMMARY OF THE INVENTION

In accordance with the present invention, a method and apparatus for loading a wafer into a microscope by using a removable wafer mounting tray to position a wafer in a test machine is provided.

In a preferred embodiment, a removable wafer mounting tray for positioning a wafer in a microscope is provided which includes a tray body of generally a disc shape having a top surface, a recess in the top surface adopted for receiving a wafer to be tested, and a handle extending outwardly from the tray body adapted for gripping by a machine arm or by a human hand.

In another preferred embodiment, a wafer test machine of the type wherein a single wafer is loaded into the machine each time for testing, is provided, the machine includes a test head having connection means for making electrical connections with a wafer, a removable wafer mounting tray for carrying a wafer in and out of the test machine and for intimately mating with a prober stage, and a prober stage capable of indexing the wafer with the connection means on the test head.

The present invention is further directed to a method for presenting a wafer to a test machine for testing including the operating steps of first providing a wafer mounting tray adapted for receiving a wafer in a recessed area in the tray, then mounting a wafer to be tested in the recessed area, and then positioning the wafer mounting tray in the test machine.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method and apparatus for loading a wafer into a microscope by utilizing a removable wafer mounting tray for positioning a wafer in the microscope such that the wafer is protected by the mounting tray during transit to and from the microscope and thus eliminating potential damages to the wafer.

The present invention provides numerous advantages over the conventional method of loading a wafer by a vacuum pick up device directly into a test machine such as a microscope and therefore subjecting the wafer to numerous potential hazardous conditions. For instance, the present invention method eliminates the danger of wafer being broken by the vacuum pick up device when vacuum is broken during a malfunction, eliminates the danger of the wafer being positioned in a cassette slanted and thus damaged by an autoloader, and furthermore, eliminates the danger of the wafer being damaged by error in the autoloader transfer arm.

Figure 1:
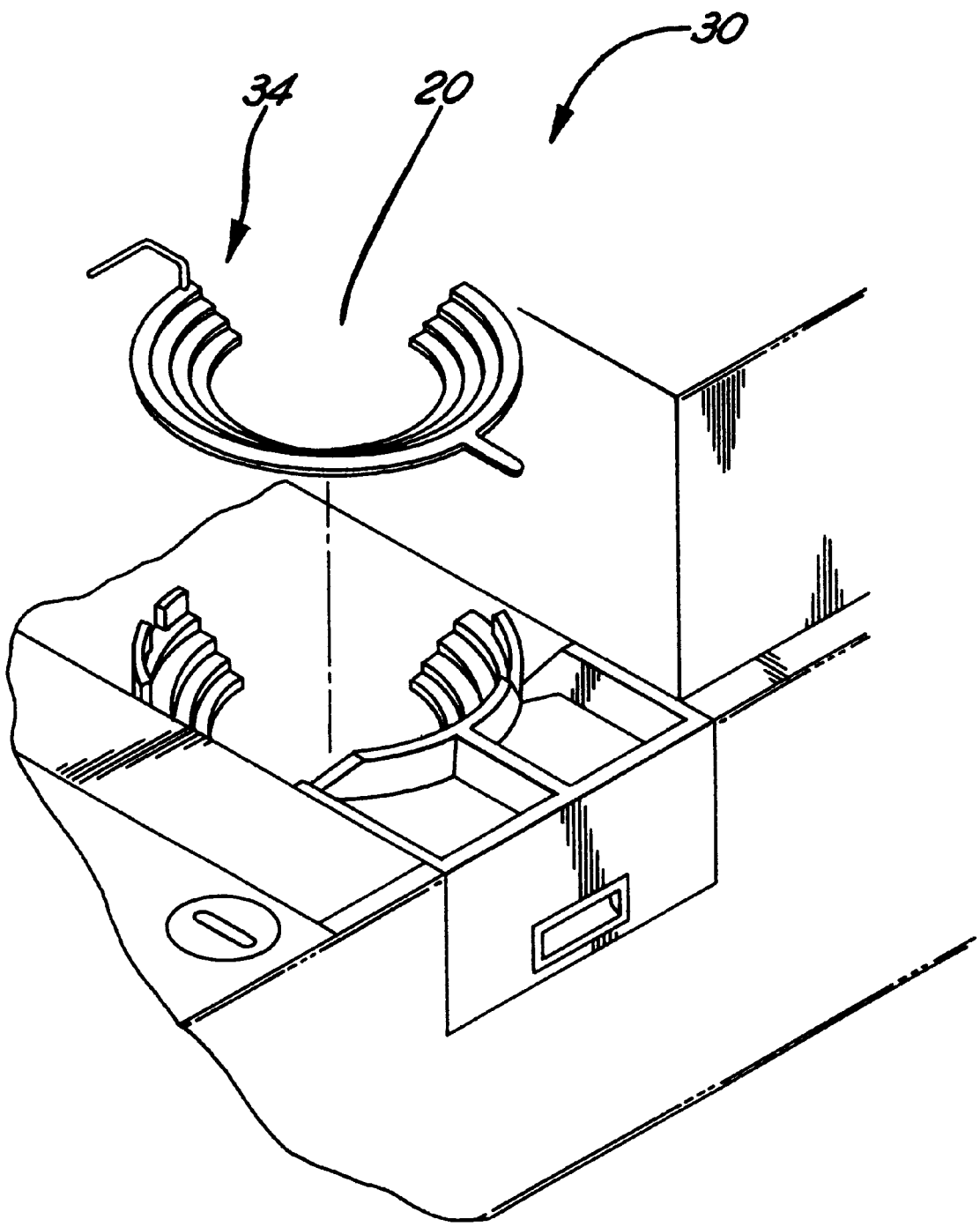
FIG. 1 is a perspective view of the present invention removable wafer mounting tray in the environment that it is mounted thereto.

In a manual load station 30 that utilizes the present invention apparatus 34 is shown in FIG. 1, a wafer inspection operation can be described by the following process flow. First, a transfer arm (not shown) picks up a wafer from a wafer cassette (not shown) and then place it into a pre-alignment station to locate the notch in the wafer. After the notch is located, the transfer arm places the wafer on a wafer chuck (not shown). The machine then starts the probing (or testing) step. After the probing is completed on the wafer, the transfer arm sends the wafer to either a manual load station on a wafer cassette, based on a pre-determined setting on the machine. If the wafer is sent to the manual load station, the machine operator picks up the removable tray 34 from the manual load station 30 and placing it into a microscope for inspection. After the inspection is completed, the removable tray 34 (together with a wafer) is placed back into the manual load station 30. The transfer arm then transports the wafer back into the wafer cassette. The notch 20 in the removable tray 34 is provided for easy access by the transfer arm.

Figure 2A:
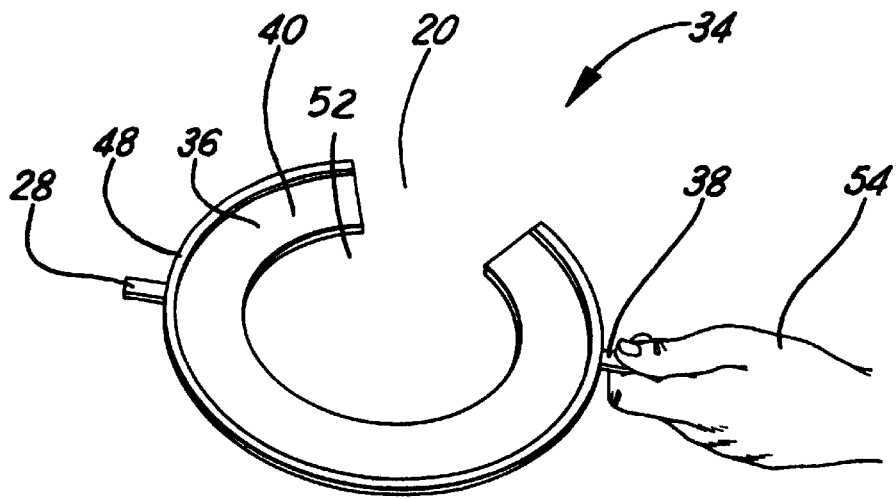
FIG. 2A is a perspective view of a present invention removable wafer mounting tray held by an operator.
Figure 2B:
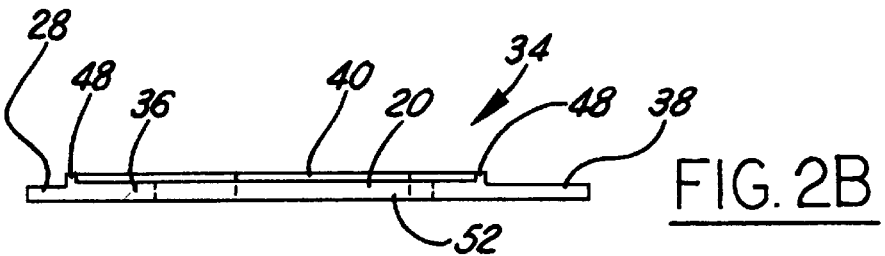
FIG. 2B is a cross-sectional view of the present invention removable wafer mounting tray of FIG. 2A.

An enlarged, perspective view of the removable wafer mounting tray 34 is shown in FIG. 2A. The removable wafer mounting tray 34 consists of a tray body 36, a notch 20 and two handle portions 28 and 38 that extend outwardly from the tray body 36. A cross-sectional view of the removable wafer mounting tray 34 is shown in FIG. 2B. It is noted that the tray body 36 is formed generally in a disc shape. The tray body 36 may be in a circular shape such as that shown in FIG. 2A, or in any other suitable shapes such as an oval shape, square shape or rectangular shape as long as the cavity 40 is provided in the shape of a wafer, i.e., a 150 mm or 200 mm diameter hole.

The recess 40 in the tray body 36 is formed by a raised edge 48 along the peripheral edge of the tray body 36. The height of the raised edge (not shown) should be substantially similar to the thickness of the wafer to be carried in the recess. A hollow center portion 52 is provided in the tray body 36 shown in FIGS. 2A and 2B for the purpose of achieving more uniform temperature distribution in the prober and especially, near and surrounding the wafer 32. This is desirable since most wafer reliability tests are conducted at higher than room temperatures. The hollow center portion 52 also serves the purpose of saving materials used to construct the wafer mounting tray 34 and furthermore, saving weight.

While a human hand 54 is shown holding the wafer mounting tray 34, the wafer mounting tray can be equally advantageously picked up by a machine arm in an automated fashion without the involvement of an operator. The tray body 36 shown in FIG. 2A is substantially in a toroidal shape which is one of the more desirable configurations for holding a wafer.

Figure 3A:
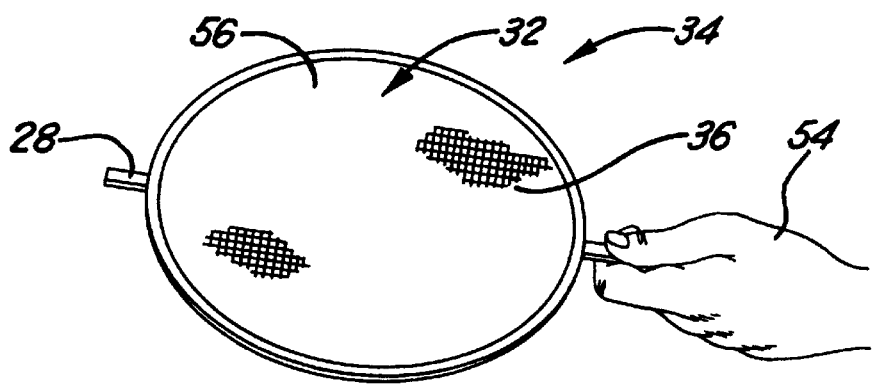
FIG. 3A is a perspective view of the present invention removable wafer mounting tray with a wafer mounted therein.
Figure 3B:
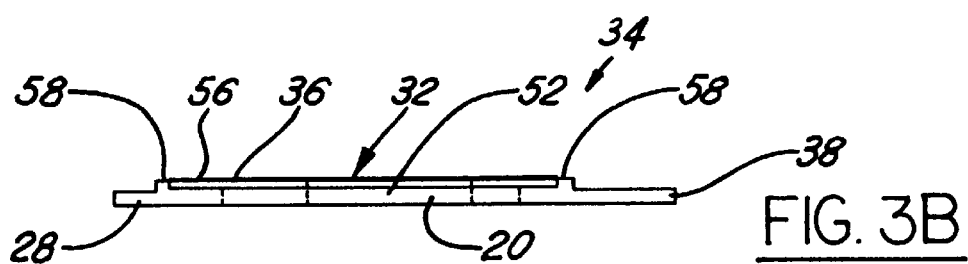
FIG. 3B is a cross-sectional view of the present invention removable wafer mounting tray of FIG. 3A with a wafer mounted therein.

Referring now to FIGS. 3A and 3B, wherein the present invention removable wafer mounting tray 34 is shown with a wafer 32 mounted therein. It is seen that semiconductor devices, or dies 36 are formed on the surface 56 of the wafer 32. Each of the dies 36 may be indexed and oriented by a prober in the X, Y direction for observation by a microscope. It should be noted that, in FIG. 3B, it is shown that the top surface 56 of the wafer 32 is essentially in the same plane as the top surface 58 of the tray body 36. This ensures a smooth operation of the wafer mounting tray with a wafer 32 mounted therein and minimizing the potential of scratching the wafer. The wafer mounting tray can be constructed of any suitable materials that are high temperature resistant and capable of maintaining its rigidity at such high temperatures. The materials include ceramic materials and high strength metals.

The advantages achieved by the present invention novel removable wafer mounting tray have been amply demonstrated and shown by the above description and the appended drawings of FIGS. 1, 2A, 2B, 3A and 3B. The novel wafer mounting tray provided by the present invention can be used to essentially eliminate or minimize the wafer breakage problem due to a vacuum break of a vacuum pick up device used in the conventional method. Furthermore, the present invention novel method and apparatus further eliminate the wafer breakage or scratch problems due to improper autoloader transfer arm operation which are frequently observed in conventional wafer mounting method.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A wafer test machine of the type wherein a single wafer is loaded into the machine each time for testing, the machine comprising:

a test head including connection means for making electrical connections with a wafer;

a removable wafer mounting tray for carrying a wafer in and out of the test machine and for intimately mating with a prober stage, said removable wafer mounting tray includes a tray body of generally a disc shape having a top surface, a recess in said top surface adapted for receiving a wafer to be tested, and a handle extending outwardly from said tray body adapted for gripping by a machine arm or by a human hand; and a prober stage for connecting said wafer with said connection means on said test head.

2. A wafer test machine according to claim 1, wherein said prober stage is capable of moving in x, y and z directions.

3. A wafer test machine according to claim 1, wherein said tray body has a hollow center portion.

4. A wafer test machine according to claim 1, wherein said recess having a depth such that when a wafer is positioned in the recess, the top surface of the tray body is substantially in the same plane as the top surface of the wafer.

5. A wafer test machine according to claim 1, wherein said handle is rigidly secured to said tray body for holding by a human hand.

6. A wafer test machine according to claim 1, wherein said tray body having a raised edge along its periphery defining said recess.

* * * * *